(12) United States Patent
Nizza et al.

(10) Patent No.: US 12,671,405 B2
(45) Date of Patent: Jun. 30, 2026

(54) SELF-BIASED POWER SWITCHING CIRCUITRY

(71) Applicant: Apple Inc., Cupertino, CA (US)

(72) Inventors: Nicolo' Nizza, Marsala (IT); Enrico Pardi, Pisa (IT)

(73) Assignee: Apple Inc., Cupertino, CA (US)

( * ) Notice: Subject to any disclaimer, the term of this patent is extended or adjusted under 35 U.S.C. 154(b) by 202 days.

(21) Appl. No.: 18/639,697

(22) Filed: Apr. 18, 2024

(65) Prior Publication Data

US 2025/0330168 A1     Oct. 23, 2025

(51) Int. Cl.
*H03K 17/081*          (2006.01)

(52) U.S. Cl.
CPC .............................. *H03K 17/08104* (2013.01)

(58) Field of Classification Search
CPC ................................................ H03K 17/08104
USPC ............................................................. 361/56
See application file for complete search history.

(56) References Cited

U.S. PATENT DOCUMENTS

| | | | | |
|---|---|---|---|---|
| 4,039,865 A | * | 8/1977 | Ohhinata | ........... H03K 17/0403 |
| | | | | 327/438 |
| 5,717,560 A | * | 2/1998 | Doyle | .................. H10D 89/811 |
| | | | | 361/111 |

| | | | | |
|---|---|---|---|---|
| 5,818,281 A | * | 10/1998 | Ohura | ................ H03K 17/0828 |
| | | | | 327/198 |
| 9,065,326 B2 | | 6/2015 | Häfner et al. | |
| 9,640,617 B2 | | 5/2017 | Das et al. | |
| 10,141,302 B2 | | 11/2018 | Das et al. | |
| 10,153,364 B2 | | 12/2018 | Henning et al. | |
| 2020/0233441 A1 | * | 7/2020 | Morimoto | ............. B60L 3/0076 |
| 2023/0170882 A1 | * | 6/2023 | Shah | .................... H03K 17/102 |
| | | | | 327/143 |

* cited by examiner

*Primary Examiner* — Kevin J Comber
(74) *Attorney, Agent, or Firm* — Treyz Law Group; Jason Tsai

(57)          ABSTRACT

Power switching circuitry is provided that includes a power switch having a first terminal coupled to a first power domain and having a second terminal coupled to a second power domain, a diode coupled between the first and second terminals of the power switch, and a pull-down circuit coupled between the second terminal of the power switch and a gate terminal of the power switch. The pull-down circuit can be a pull-down transistor. The power switching circuitry can further include a feedforward resistor coupled between the first terminal of the power switch and a gate terminal of the pull-down transistor. The power switching circuitry can further include a voltage clamping circuit configured to limit a voltage at the gate terminal of the pull-down transistor and an additional transistor configured to selectively disable the voltage clamping circuit.

19 Claims, 4 Drawing Sheets

SELF-BIASED POWER SWITCHING CIRCUITRY

FIELD

Embodiments described herein relate generally to integrated circuits and, more particularly, to integrated circuits with one or more power transistors.

BACKGROUND

Integrated circuits can include power transistors such as power metal-oxide-semiconductor field-effect transistors (MOSFETs). Power MOSFETs are often used to deliver power to certain on-chip or off-chip power supply rails. A power MOSFET can be coupled between two different power supply terminals and can be configured to provide electrical isolation between the two different power supply terminals.

It can be challenging to design power transistors. If care is not taken, a power MOSFET can be inadvertently activated and a large amount of current can flow through the power MOSFET between the two different power supply terminals, thereby breaching the desired electrical isolation. It is within this context that the embodiments herein arise.

SUMMARY

An aspect of the disclosure relates to power switching circuitry that includes a power switch having a first terminal coupled to a first power domain and having a second terminal coupled to a second power domain, a diode coupled between the first and second terminals of the power switch, and a pull-down circuit coupled between the second terminal of the power switch and a gate terminal of the power switch. The power switching circuitry can further include a passive electrical component having a first terminal coupled to the first terminal of the power switch and having a second terminal coupled to the pull-down circuit. The power switching circuitry can further include a voltage clamping circuit coupled to the pull-down circuit, a current discharge circuit configured to sink current flowing through the voltage clamping circuit, a clamp disabling circuit configured to selectively disable the voltage clamping circuit, and a gate driver circuit coupled to the second terminal of the power switch and having an output that is coupled to the clamp disabling circuit and the gate terminal of the power switch.

An aspect of the disclosure relates to circuitry that includes a power switch having a first terminal coupled to a first power supply terminal and having a second terminal coupled to a second power supply terminal, the power switch having a first voltage rating, a diode having an anode terminal coupled to the second terminal of the power switch and having a cathode terminal coupled to the first terminal of the power switch, and a pull-down transistor having a first source-drain terminal coupled to the second terminal of the power switch and having a second source-drain terminal coupled to a gate terminal of the power switch. The pull-down transistor can have a second voltage rating different or less than the first voltage rating.

An aspect of the disclosure relates to circuitry that includes a power transistor having a first source-drain terminal electrically coupled to a first power domain and having a second source-drain terminal electrically coupled to a second power domain, a diode having a cathode terminal coupled to the first source-drain terminal of the power transistor and having an anode terminal coupled to the second source-drain terminal of the power transistor, a pull-down transistor having a first source-drain terminal coupled to the second source-drain terminal of the power transistor and having a second source-drain terminal coupled to a gate terminal of the power transistor, and a resistor having a first terminal coupled to the first source-drain terminal of the power transistor and having a second terminal coupled to a gate terminal of the pull-down transistor.

Further features of the invention, its nature and various advantages will be more apparent from the accompanying drawings and following detailed description.

DETAILED DESCRIPTION

Figure 1:
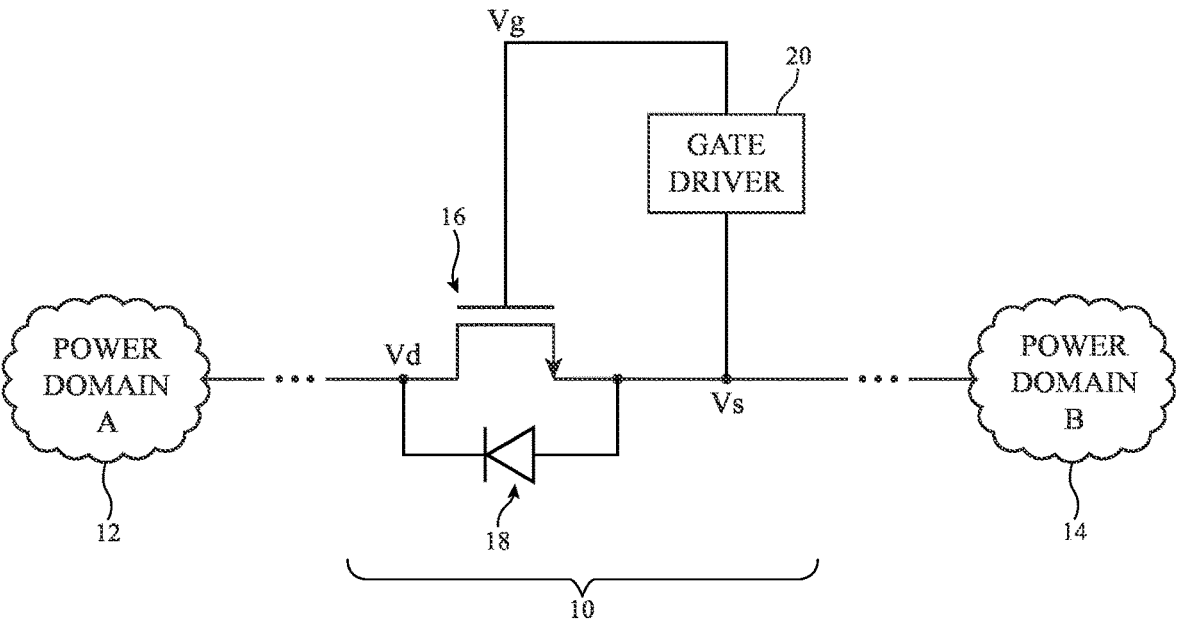
FIG. 1 is a diagram of an illustrative power transistor electrically coupled between two power domains in accordance with some embodiments.

This relates to integrated circuitry having power devices such as power transistors. Power transistors are frequently employed as switches for delivering power to certain on-chip or off-chip power supply rails. Power transistors are often, although not necessarily, coupled to external pins, sometimes referred to as input-output pins that are coupled to external power supplies. FIG. 1 is a diagram of an illustrative power transistor such as power transistor 16 electrically coupled between two power domains in accordance with some embodiments. As shown in FIG. 1, power transistor 16 may be electrically coupled between a first (A) power domain 12 and a second (B) power domain 14.

The first power domain 12 may be configured to operate in accordance with a first set of power supply parameters (e.g., using a first set of power supply voltages having a first power supply range), whereas the second power domain 14 may be configured to operate in accordance with a second set of power supply parameters (e.g., using a second set of power supply voltages having a second power supply range). The first power domain 12 may be coupled to one or more first power supply terminal(s). The second power domain 14 may be coupled to one or more second power supply terminal(s).

As an example, the first set of power supply parameters may be different than the second set of power supply parameters (e.g., the first set of power supply voltages can be different than the second set of power supply voltages, and/or the first power supply range can be different than the second power supply range). As another example, the second set of power supply parameters may be identical to the second set of power supply parameters (e.g., the first set of power supply voltages can be equal to the second set of power supply voltages, and/or the first power supply range can be equal to the second power supply range). First power domain 12 is sometimes referred to as a first power supply domain, whereas second power domain 14 is sometimes referred to as a second power supply domain.

Power transistor 16 can have a drain terminal coupled to first power domain 12, a source terminal coupled to second power domain 14, and a gate terminal. The voltage at the drain terminal of power transistor 16 can be referred to as drain voltage Vd; the voltage at the source terminal of power transistor 16 can be referred to as source voltage Vs; and the voltage at the gate terminal of power transistor 16 can be referred to as gate voltage Vg. In general, the drain terminal of power transistor 16 can be coupled to an internal (on-chip) or external (off-chip) power supply rail (e.g., power domain 12 can represent either an internal power supply domain or an external power supply domain). Similarly, the source terminal of power transistor 16 can be coupled to an internal (on-chip) or external (off-chip) power supply rail (e.g., power domain 14 can represent either an internal power supply domain or an external power supply domain).

As an example, power transistor 16 can be a metal-oxide-semiconductor field-effect transistor (MOSFET). This is merely illustrative. In other embodiments, power transistor 16 can be implemented as one or more bipolar junction transistors (BJTs), one or more insulated gate bipolar transistors (IGBTs), one or more silicon carbide (SiC) and gallium nitride (GaN) transistors, a voltage-controlled device, a current-controlled device, a combination of these transistors, and/or other types of transistors or switches. The terms "source" and "drain" are sometimes used interchangeably when referring to current-conducting terminals of a metal-oxide-semiconductor transistor. The source and drain terminals are therefore sometimes referred to as "source-drain" terminals. In the example of FIG. 1, the drain terminal of transistor 16 can be referred to as a first source-drain terminal, whereas the source terminal of transistor 16 can be referred to as a second source-drain terminal, or vice versa. The term "activate" with respect to a transistor (or switch) may refer to or be defined herein as an action that places the switch/transistor in an "on" or low-impedance state such that the two terminals of the switch/transistor are electrically connected to conduct current. The term "deactivate" with respect to a transistor (o switch) may refer to or be defined herein as an action that places the switch in an "off" or high-impedance state such that the two terminals of the switch/transistor are electrically disconnected with a minimal amount of leakage current.

A diode component such as diode 18 may be coupled across the source-drain terminals of power transistor 16. As shown in FIG. 1, diode 18 may have a p-type (anode) terminal coupled to the source terminal of power transistor 16 and may have an n-type (cathode) terminal coupled to the drain terminal of power transistor 16. Diode 18 coupled in parallel with power transistor 16 is sometimes referred to as a power diode. Power transistor 16 can also be coupled to a gate driving circuit such as gate driver 20. Gate driver 20 may be coupled between the source and gate terminals of power transistor 16. Gate driver 20 can be selectively enabled (activated) and disabled (deactivated). When enabled, gate driver 20 can control the gate-to-source voltage or "Vgs" of power transistor 16 and can be configured to ensure that power transistor 16 remains in a low resistance (on) state or a high resistance (off) state. Power transistor 16, power diode 18, and associated gate driver 20 are sometimes referred to collectively herein as power switching circuitry 10. Power transistor 16 is sometime referred to more generically as a power switch or a power supply switch. A "power transistor" or a "power switch" can refer to and be defined herein as a transistor or switch having current-conducting terminals coupled to two separate power domains (e.g., a switch that is interposed between two different sets of power supply voltages).

Figure 2:
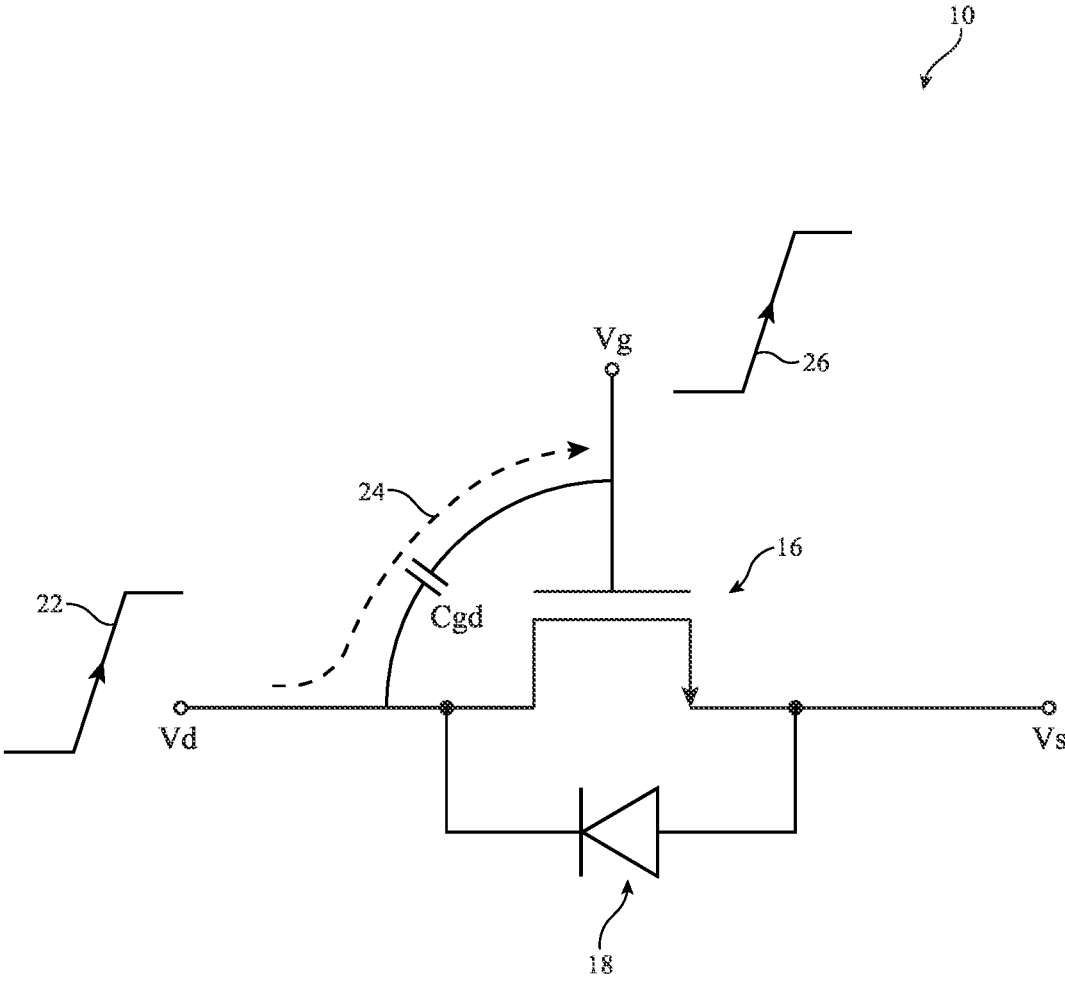
FIG. 2 is a diagram showing how a transient waveform at a drain terminal of the power transistor can be capacitively coupled to a gate terminal of the power transistor.

In certain scenarios, power transistor 16 should be deactivated or turned off to provide electrical isolation between power domain 12 and power domain 14 (e.g., to prevent current from flowing between the two power supply domains). During practice, however, it is possible that a transient event at a source-drain terminal can cause the power transistor to advertently turn on during a period when that power transistor should have been turned off. FIG. 2 is a diagram showing how a transient waveform at the drain terminal of power transistor 16 can be capacitively coupled to the gate terminal of power transistor 16. As shown in FIG. 2, a transient event can cause voltage Vd at the drain terminal of power transistor 16 to rise (as illustrated by transient waveform 22). This rise in voltage Vd can be capacitively coupled to the gate terminal of power transistor 16 via a parasitic gate-to-drain capacitance Cgd of power transistor 16 (as illustrated by parasitic coupling path 24). This parasitic coupling can cause voltage Vg at the gate terminal of power transistor 16 to rise in a similar fashion (as illustrated by transient waveform 26). If care is not taken, this rise in Vg can inadvertently activate power transistor 16 when transistor 16 should have been in an off state.

Figure 3:
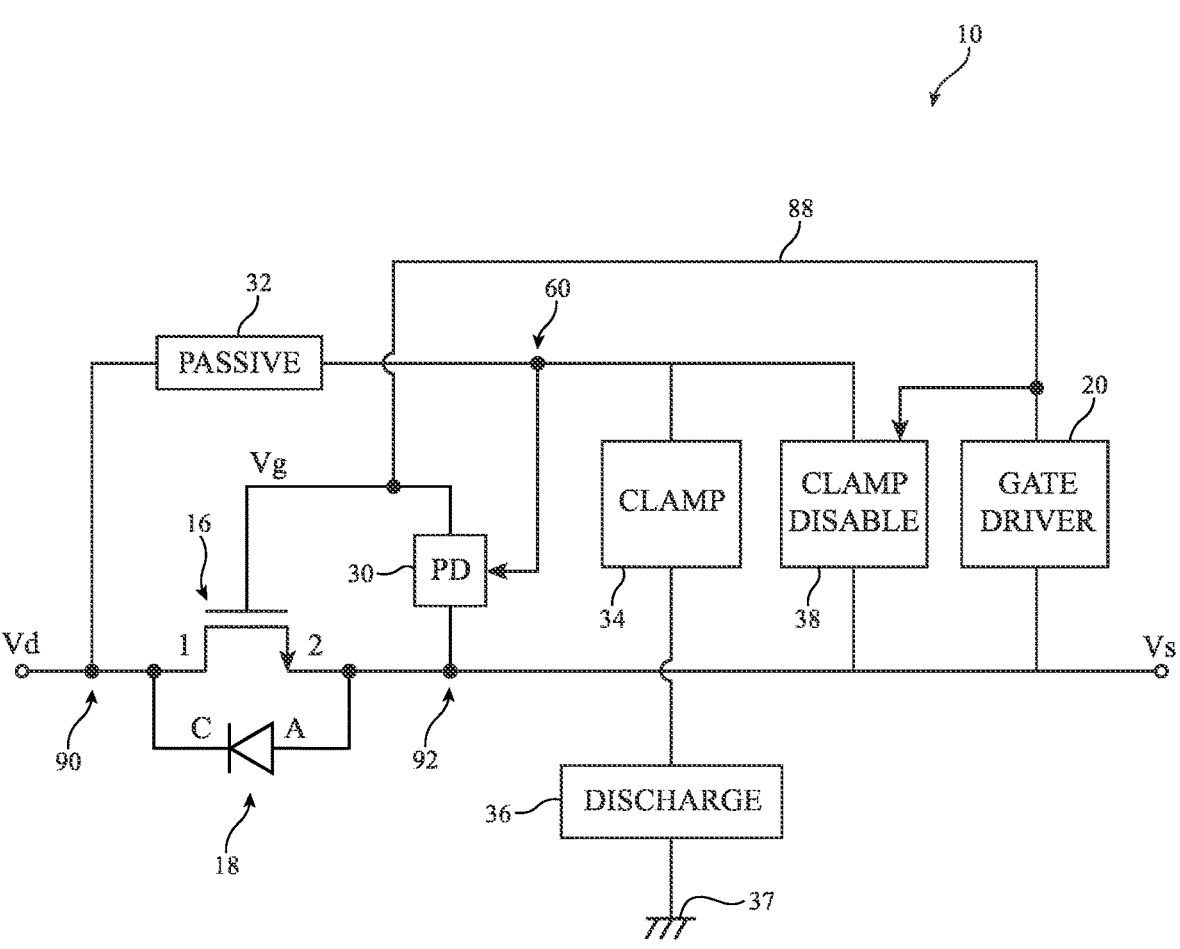
FIG. 3 is a block diagram of illustrative power switching circuitry configured to provide proper electrical isolation between two different power domains in accordance with some embodiments.

In accordance with an embodiment, FIG. 3 shows power switching circuitry 10 configured to ensure that power transistor 16 remains in the off state during such transient events (see, e.g., FIG. 3). As shown in FIG. 3, power switching circuitry 10 may include power transistor 16, power diode 18, gate driver circuit 20, a pull-down (PD) circuit such as pull-down circuit 30, a passive component such as passive feedforward component 32, a clamping circuit such as voltage clamping circuit 34, a discharging circuit such as discharge circuit 36, and a clamp disable circuit such as clamp disable circuit 38. Diode 18 may have a first (cathode) terminal coupled to the first source-drain terminal (node 90) of power transistor 16 and may have a second (anode) terminal coupled to the second source-drain terminal (node 92) of power transistor 16. Gate driver 20 may have a first terminal coupled to the second source-drain terminal of power transistor 16 and may have a second terminal coupled to the gate terminal of power transistor 16 via connection path 88.

Pull-down (PD) circuit 30 may have a first terminal coupled to node 92 and may have a second terminal coupled to the gate terminal of power transistor 16. Pull-down circuit 30 further includes a control terminal configured to receive a control signal from node 60. Pull-down circuit 30 can be selectively activated to connect the gate terminal of power transistor 16 to its second source-drain terminal. By selectively connecting these two terminals, pull-down circuit 30 can pull voltage Vg towards the voltage at node 92 (e.g., the source terminal), thus reducing the Vgs of power transistor 16 to keep power transistor in the off state.

Passive component 32 may have a first terminal coupled to node 90 and a second terminal coupled to node 60. Configured in this way, passive component 32 can provide a sensing path for feeding forward a version of voltage Vd at node 90 onto corresponding node 60. Clamping circuit 34 may be coupled between node 60 and discharge circuit 36. Clamping circuit 34 may be configured to protect pull-down circuit 30. For example, clamping circuit 34 can be configured to clamp voltage Vg to be no greater than some multiple of Vgs of power transistor 16 (e.g., so that the voltage at node 60 is clamped or limited to no more than 2*Vgs, 3*Vgs, 4*Vgs, 1.5*Vgs, 1-2 times Vgs, 2-3 times Vgs, 1.5-2.5 times Vgs, or other integer or non-integer multiple of Vgs). Discharge circuit 36 may provide a current discharge path for clamping circuit 34 (e.g., for discharging current to ground power supply line 37). Discharge circuit 36 is therefore sometimes referred to as a current discharge circuit configured to sink current flowing through voltage clamping circuit 34. Ground power supply line 37 can be referred to as a ground line, ground terminal, or ground. Clamp disable circuit 38 may be coupled between node 60 and node 92 and may be configured to selectively disable clamping circuit 34. Clamp disable circuit 38 can further include a control terminal coupled to an output of gate driver 20 (e.g., to path 88).

Power switching circuitry 10 configured in this way can be technically advantageous and beneficial to ensure that power switch 16 remains in the off state during transient events by preventing any parasitic Cgd coupling from inadvertently activating switch 16 with zero DC (direct current) sunk from associated power supplies. This power switching arrangement can also provide power rail isolation with minimal area overhead.

Figure 4:
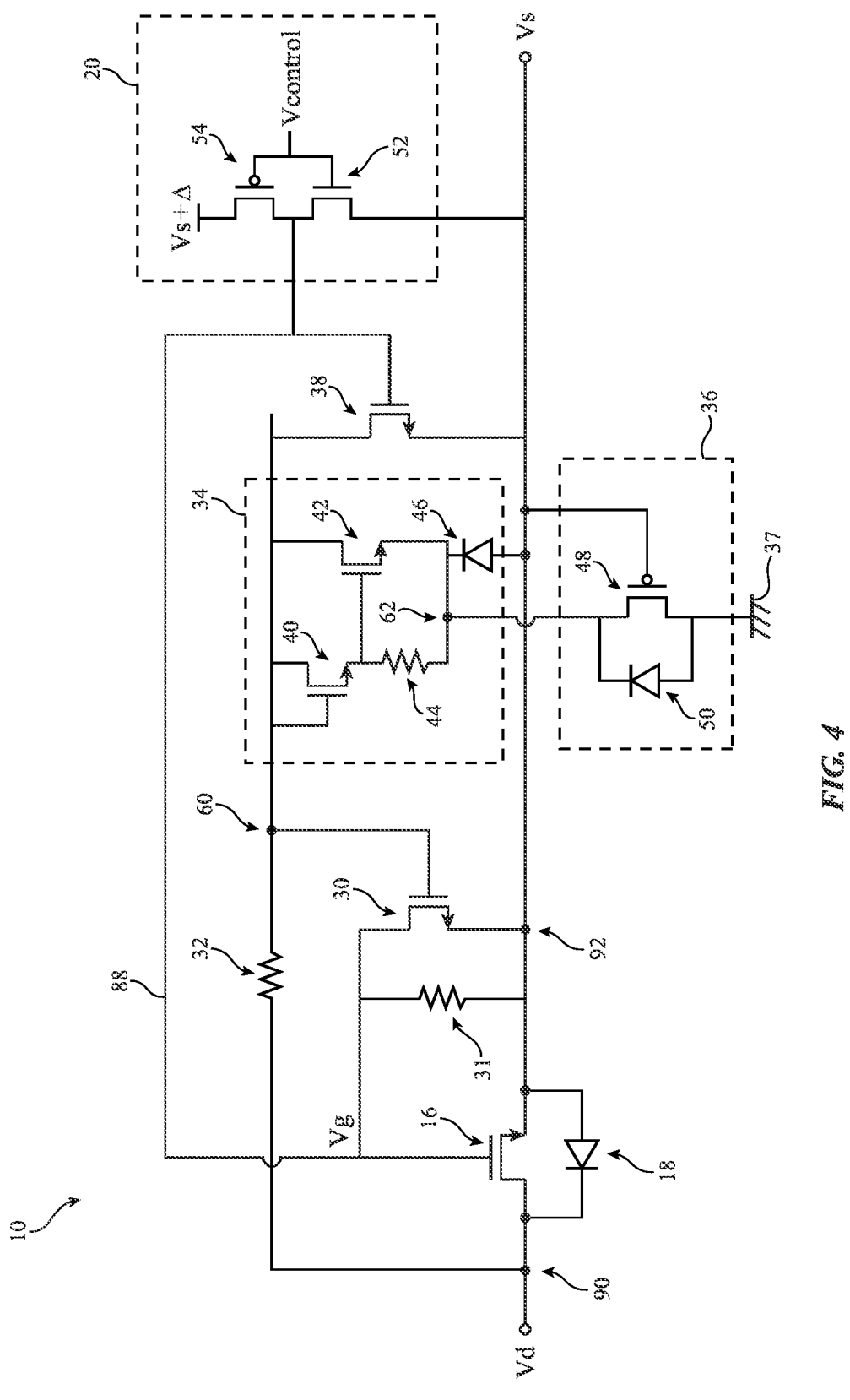
FIG. 4 is a circuit diagram showing an illustrative implementation of the power switching circuitry of FIG. 3 in accordance with some embodiments.

FIG. 4 is a circuit diagram showing an illustrative implementation of power switching circuitry 10 of the type described in connection with FIGS. 1-3. As shown in FIG. 4, pull-down circuit 30 can be implemented as an n-type (n-channel) transistor, sometimes referred to herein as a pull-down transistor 30. Pull-down transistor 30 can include a first source-drain terminal coupled to node 92, a second source-drain terminal coupled to the gate terminal of power transistor 16, and a gate terminal coupled to node 60. Any transient-induced AC (alternating-current) current coupled across the parasitic gate-to-drain capacitance Cgd of power transistor 16 (see, e.g., FIG. 2) can be sunk by pull-down transistor 30. Pull-down transistor 30 can be selectively activated when the voltage at node 16 rises above a certain threshold.

In accordance with some embodiments, power transistor 16 and pull-down transistor 30 can have different voltage ratings. A transistor's "voltage rating" sets or defines a maximum voltage that is allowed between two different terminals of a transistor. Consider an example in which power transistor 16 has a maximum Vgs rating of 5 V but has a maximum Vgd (e.g., gate-to-drain voltage) rating and Vds (e.g., drain-to-source voltage) rating of 10 V or more. Here, since pull-down transistor 30 is coupled across the gate and source terminals of power transistor 16, the maximum Vds rating of pull-down transistor 30 should be limited to 5 V in this example. In other words, the Vds rating of pull-down transistor 30 should be less than the Vds rating of power transistor 16.

A transistor's voltage rating may be related to that transistor's breakdown voltage. A transistor's "breakdown voltage" can refer to a maximum amount of voltage that can be applied across its terminals before that transistor enters a state of electrical breakdown. In other words, a transistor's breakdown voltage sets a voltage level at which the transistor starts to experience a sudden increase in current flow that can potentially damage the transistor and other surrounding components. As described above, the voltage rating of pull-down transistor 30 can be less than the voltage rating of power transistor 16. In other words, pull-down transistor 30 can have a breakdown voltage that is less than the breakdown voltage of power transistor 16. Transistors having higher breakdown voltage typically require larger circuit area, so implementing pull-down transistor 30 with a smaller breakdown voltage requirement can help reduce circuit area overhead. The example of FIG. 4 in which pull-down circuit 30 is implemented as a n-type transistor (e.g., an n-type metal-oxide-semiconductor or NMOS device) is illustrative. In general, pull-down circuit 30 can be implemented using other types of pull-down device.

Resistor 31 can have a first terminal coupled to node 92 and can have a second terminal coupled to the gate of power transistor 16. Configured in this way, resistor 31 can help guarantee a power switch DC off state. Resistor 31 is therefore sometimes referred to as a pull-down resistor. The example of FIG. 4 in which a static resistor 31 is coupled across the gate and source terminals of power transistor 16 is illustrative. In general, other types of static pull-down components can be employed.

Passive component 32 can be implemented as a resistor. Resistor 32 is sometimes referred to as a feedforward resistor. Feedforward resistor 32 has a first terminal coupled to node 90 and has a second terminal coupled to node 60. The example of FIG. 4 in which a feedforward passive component 32 is implemented as a resistor is illustrative. In general, the feedforward passive component 32 can be implemented as a capacitor, an inductor, and/or other types of passive electrical components.

In the example of FIG. 4, clamping circuit 34 can include transistors 40 and 42, a resistor 44, and a diode 46. Transistor 40 can be an n-type transistor having gate and drain terminals coupled to node 60. Transistor 42 can be an n-type transistor having a drain terminal coupled to node 60, a gate terminal coupled to a source terminal of transistor 40, and a source terminal coupled to node 62. Clamping circuit 34 can sink current into node 62, so node 62 is sometimes referred to as a "sink" node. Resistor 44 may have a first terminal coupled to the source terminal of transistor 40 and a second terminal coupled to sink node 62. Diode 46 may have a first (p-type) terminal coupled to node 92 and a second (n-type) terminal coupled to sink node 62. The circuit structure of clamping circuit 34 as shown in FIG. 4 is exemplary. In general, other types of voltage clamping circuitry can be employed here.

Discharge circuit 36 may be coupled to sink node 62. Discharge circuit 36 may include a transistor 48 and a diode 50. Transistor 48 may be a p-type transistor (e.g., a p-channel metal-oxide-semiconductor or PMOS device) having a first source-drain terminal coupled to sink node 62, a gate terminal coupled to node 92, and a second source-drain terminal coupled to ground line 37. Diode 50 may have a first (p-type) terminal coupled to ground 37 and a second (n-type) terminal coupled to sink node 62. Diode 50 arranged in this way is sometimes referred to as being coupled "in parallel" with transistor 48. Any current feed from the drain terminal of power transistor 16 through resistor 32 can flow to ground via circuits 34 and 38. The circuit structure of discharge circuit 36 as shown in FIG. 4 is exemplary. In general, other types of signal discharging or charging circuitry can be employed here to draw or provide current to clamping circuit 34.

In the example of FIG. 4, clamp disable circuit 38 may be implemented as a transistor. Transistor 38 may be an n-type transistor having a source terminal coupled to node 92, a drain terminal coupled to node 60, and a gate terminal coupled to the gate of power transistor 16 via path 88. Transistor 38 can be selectively activated to disable clamping circuit 34. Transistor 38, sometimes referred to as a clamp disable transistor, can receive a disable control signal at its gate terminal. When the disable control signal is asserted (e.g., driven high), transistor 38 can be activated to disable clamping circuit 34. When the disable control signal is deasserted (e.g., driven low), transistor 38 can be deactivated to allow clamping circuit 34 to function normally.

Gate driver 20 may have an output coupled to the gate terminal of transistor 38 and control path 88. In other words, gate driver 20 can be configured to output the disable control signal to the gate terminal of clamp disable transistor 38. Gate driver 20 may include transistors 52 and 54. Transistor 52 may be an n-type (e.g., NMOS) transistor having a source terminal coupled to node 92, a drain terminal coupled to the gate terminal of power transistor 16, and a gate terminal configured to receive a digital control signal Vcontrol. Control signal Vcontrol may be received at an input of gate driver 20. Transistor 54 may be a p-type (e.g., PMOS) transistor having a drain terminal coupled to the gate terminal of power transistor 16, a gate terminal configured to receive digital control signal Vcontrol, and a source terminal configured to receive an elevated or boosted voltage that is some voltage difference A greater than the voltage at the source terminal of transistor 52. In the example of FIG. 4, if the voltage at the source terminal of transistor 52 is equal to voltage Vs, then the voltage at the source terminal of transistor 54 can be (Vs+$\Delta$). Voltage difference A can be 1 V, 1-5 V, 5-10 V, 10-20V, or more than 20 V. The circuit structure of gate driver 20 as shown in FIG. 4 is exemplary. In general, other types of gate driver circuitry can be employed here to drive the gate terminal of power transistor 16.

Power switching circuitry 10 of the type described in connection with at least FIGS. 3-4 in which pull-down transistor 30 does not need a separate biasing circuit is sometimes referred to as self-biased power switching circuitry. The foregoing is merely illustrative and various modifications can be made to the described embodiments. The foregoing embodiments may be implemented individually or in any combination.

What is claimed is:

1. Power switching circuitry comprising:
   a power switch having a first terminal coupled to a first power domain having a first voltage range and having a second terminal coupled to a second power domain having a second voltage range different than the first voltage range;
   a diode coupled between the first and second terminals of the power switch; and
   a pull-down circuit coupled between the second terminal of the power switch and a gate terminal of the power switch.

2. The power switching circuitry of claim 1, further comprising:
   a passive electrical component having a first terminal coupled to the first terminal of the power switch and having a second terminal coupled to the pull-down circuit.

3. The power switching circuitry of claim 2, further comprising:
   a voltage clamping circuit coupled to the pull-down circuit; and
   a current discharge circuit configured to sink current flowing through the voltage clamping circuit.

4. The power switching circuitry of claim 3, further comprising:
   a clamp disabling circuit configured to selectively disable the voltage clamping circuit.

5. The power switching circuitry of claim 4, further comprising:

a gate driver circuit coupled to the second terminal of the power switch and having an output that is coupled to the clamp disabling circuit and the gate terminal of the power switch.

6. The power switching circuitry of claim 5, wherein the gate driver circuit comprises:
   an n-type transistor having a source terminal coupled to the second terminal of the power switch, a drain terminal coupled to its output, and a gate terminal configured to receive a control signal; and
   a p-type transistor having a drain terminal coupled to its output, a gate terminal configured to receive the control signal, and a source terminal configured to receive a boosted voltage that is greater than a voltage at the second terminal of the power switch.

7. The power switching circuitry of claim 2, wherein the passive electrical component comprises a resistor.

8. The power switching circuitry of claim 1, wherein the power switch comprises an n-type transistor having a first source-drain terminal coupled to the first power domain and having a second source-drain terminal coupled to the second power domain.

9. The power switching circuitry of claim 1, wherein the pull-down circuit comprises an n-type transistor having a first source-drain terminal coupled to the second terminal of the power switch and having a second source-drain terminal coupled to the gate terminal of the power switch.

10. The power switching circuitry of claim 1, wherein the power switch comprises a first n-type transistor having a first voltage rating, and wherein the pull-down circuit comprises a second n-type transistor having a second voltage rating different than the first voltage rating.

11. The power switching circuitry of claim 10, wherein the first voltage rating of the first n-type transistor is greater than the second voltage rating of the second n-type transistor.

12. The power switching circuitry of claim 1, wherein the power switch comprises a first n-type transistor having a first breakdown voltage, and wherein the pull-down circuit comprises a second n-type transistor having a second breakdown voltage less than the first breakdown voltage.

13. The power switching circuitry of claim 1, wherein the power switch comprises a first n-type transistor and wherein the pull-down circuit comprises a second n-type transistor smaller than the first n-type transistor.

14. The power switching circuitry of claim 1, further comprising a resistor having a first terminal coupled to the second terminal of the power switch and having a second terminal coupled to the gate terminal of the power switch.

15. Circuitry comprising:
   a power switch having a first terminal coupled to a first power supply terminal and having a second terminal coupled to a second power supply terminal, the power switch having a first voltage rating;
   a diode having an anode terminal coupled to the second terminal of the power switch and having a cathode terminal coupled to the first terminal of the power switch; and
   a pull-down transistor having a first source-drain terminal coupled to the second terminal of the power switch and having a second source-drain terminal coupled to a gate terminal of the power switch, the pull-down transistor having a second voltage rating less than the first voltage rating.

16. The circuitry of claim 15, further comprising a resistor having a first terminal coupled to the first source-drain terminal of the pull-down transistor and having a second terminal coupled to the second source-drain terminal of the pull-down transistor.

17. The circuitry of claim 15, further comprising a feed-forward resistor having a first terminal coupled to the first terminal of the power switch and having a second terminal coupled to a gate terminal of the pull-down transistor.

18. The circuitry of claim 17, further comprising:

a voltage clamping circuit configured to limit a voltage at the gate terminal of the pull-down transistor; and an additional transistor configured to selectively disable the voltage clamping circuit.

19. Circuitry comprising:

a power transistor having a first source-drain terminal electrically coupled to a first power domain and having a second source-drain terminal electrically coupled to a second power domain;

a diode having a cathode terminal coupled to the first source-drain terminal of the power transistor and having an anode terminal coupled to the second source-drain terminal of the power transistor;

a pull-down transistor having a first source-drain terminal coupled to the second source-drain terminal of the power transistor and having a second source-drain terminal coupled to a gate terminal of the power transistor;

a voltage clamping circuit having a first terminal coupled to the second source-drain terminal of the power transistor and a second terminal; and a resistor having a first terminal directly coupled to the first source-drain terminal of the power transistor and a second terminal coupled to the second terminal of the voltage clamping circuit.

* * * * *